United States Patent
Lambert et al.

(10) Patent No.: US 6,434,020 B1
(45) Date of Patent: Aug. 13, 2002

(54) APPARATUS AND METHOD OF OPERATING TWO SWITCHES CONNECTING RESPECTIVELY A LOAD TO POWER SOURCE TERMINALS IN RESPONSE TO A SWITCH CONTROL SIGNAL

(75) Inventors: Ghislain Lambert, Beloeil; Pierre Gingras, St-Bruno, both of (CA)

(73) Assignee: Hydro-Quebec, Montreal (CA)

( * ) Notice: Subject to any disclaimer, the term of this patent is extended or adjusted under 35 U.S.C. 154(b) by 0 days.

(21) Appl. No.: 09/827,893

(22) Filed: Apr. 9, 2001

(51) Int. Cl.⁷ ............................................. H02M 3/335
(52) U.S. Cl. ........................................................ 363/17
(58) Field of Search ........................ 363/17, 41, 56.02, 363/56.03, 56.04

(56) References Cited

U.S. PATENT DOCUMENTS

| | | | |
|---|---|---|---|
| 3,654,541 A | 4/1972 | Kelley, Jr. et al. ............. | 321/13 |
| 4,314,325 A * | 2/1982 | Siebert ......................... | 363/98 |
| 4,348,734 A | 9/1982 | Dougherty ................... | 364/721 |
| 4,597,026 A | 6/1986 | Santurtûn et al. ............ | 361/101 |
| 4,658,192 A | 4/1987 | Casteel et al. ............... | 318/317 |
| 4,719,400 A | 1/1988 | Kurakake et al. ........... | 318/811 |
| 4,926,302 A | 5/1990 | Harada et al. ................ | 363/16 |
| 4,947,309 A * | 8/1990 | Jonsson ........................ | 363/17 |
| 5,099,408 A | 3/1992 | Chen et al. ................... | 363/41 |
| 5,115,387 A | 5/1992 | Miller .......................... | 363/54 |
| 5,170,334 A | 12/1992 | Ito et al. ........................ | 363/96 |
| 5,177,675 A | 1/1993 | Archer ........................ | 363/25 |
| 5,301,085 A | 4/1994 | Miettinen ..................... | 361/93 |
| 5,436,819 A | 7/1995 | Mikami et al. ................ | 363/41 |
| 5,450,306 A | 9/1995 | Garces et al. ................. | 363/41 |
| 5,506,484 A | 4/1996 | Munro et al. ............... | 318/599 |
| 5,532,562 A | 7/1996 | Yasuda ........................ | 318/439 |
| 5,546,052 A | 8/1996 | Austin et al. .................. | 331/1 |
| 5,550,436 A | 8/1996 | Houk .......................... | 315/209 |
| 5,550,450 A | 8/1996 | Palko et al. ................. | 318/800 |
| 5,623,192 A | 4/1997 | Yamamoto ................... | 318/811 |
| 5,668,489 A | 9/1997 | Jin ............................... | 327/173 |
| 5,712,772 A | 1/1998 | Tekefus et al. ............... | 363/21 |

OTHER PUBLICATIONS

The Analysis and Compensation of Dead–Time Effects in PWM Inverters—Seung–Gi Jeong et al.,—Apr. 1991—IEEE pp. 108 to 114.

* cited by examiner

Primary Examiner—Shawn Riley
(74) Attorney, Agent, or Firm—Foley & Lardner (57) ABSTRACT

A method and apparatus for operating two switches connecting respectively a load to power source terminals in response to a switch control signal. The invention detects a signal indicative of current direction through the load to identify one of the switches as an active switch. If the switch control signal is for opening the active switch, an opening gate signal is sent to the active switch and a predetermined time period is triggered. If the switch control signal is for closing the active switch, an opening gate signal is sent to the other switch, a predetermined time period is triggered, and a closing gate signal is sent to the active switch when the predetermined time period of the timer associated with the other switch has elapsed.

12 Claims, 9 Drawing Sheets

APPARATUS AND METHOD OF OPERATING TWO SWITCHES CONNECTING RESPECTIVELY A LOAD TO POWER SOURCE TERMINALS IN RESPONSE TO A SWITCH CONTROL SIGNAL

FIELD OF THE INVENTION

The present invention is concerned with an apparatus and a method of operating two switches connecting respectively a load to power source terminals in response to a switch control signal. More specifically, the present invention can be applied to PWM inverters.

BACKGROUND OF THE INVENTION

Known in the art, there is the article entitled "The Analysis and Compensation of Dead-Time Effects in PWM inverters by Seung-Gi Jeong et al., published in IEEE transactions on industrial electronics, vol. 38, no. 2, April 1991. In this article, in FIG. 1, there is shown a circuit that operates with a dead-time effect. There is shown the leg of one phase of a PWM inverter where power transistors T1 and T2 are assumed to be used as switching elements. The PWM control signal drives the transistors T1 and T2 through a time delay. The base drive signals B1 and B2 are provided for controlling the transistors T1 and T2.

With this kind of configuration, it is essential to insert a time delay in drive signals B1 and B2 in order to avoid the conduction overlap of the transistors T1 and T2. Although the time delay guarantees safe operation, it adversely affects the performance of the inverter. This time delay results in a momentary loss of control, and the inverter output voltage waveform deviates from that for which it is originally intended. Since this is repeated over and over for every switching operation, its detrimental effect may become significant in PWM inverters that operate in high switching frequency. This is known as the dead-time effect.

In this article, there is proposed a method (method II) on page 112 for compensating the dead-time effect. This method makes use of a detection of current I circulating through the load. It was observed, on the one hand that when i>0, the shape of the output voltage follows the base drive signal B1. On the other hand, when i<0, the voltage is shown to have a shape complementary to that of signal B2. From this observation, one can see that the output voltage is determined by only one of the two drive signals B1 and B2 which is called the active signal in the following description, whereas the other signal is said to be inactive. Thus, in order to maintain the original pulse width of the control signal, the active drive signal should be made to be the same (or inversely the same) as the control signal. The inactive drive signal needs only to be properly designed to guarantee a safe time delay with respect to given switching instant of the active signal.

Now referring to FIG. 8 of this article, the signal S is assumed to be a portion of the original PWM wave. S1 and S2 are delayed signals of S, by $T_d$ and $2T_d$, respectively. The following waveforms show two sets of required drive signals B1 and B2 to be synthesized for positive and negative currents, respectively. Note that the active drive signal B1 or B2 is made to be a replica (or an inverse replica) of S1. The other two signals S and S2 are used to define the transition edges of the inactive drive signal. Under the condition of i<0, the inactive drive signal B1 rises at the rising edge of S2 and drops at the falling edge of S, as is shown in FIG. 8(a), but when the pulse width is shorter than twice the time delay, as shown in FIG. 8(b), B1 is dropped out. The current direction determines which of the signals B1 and B2 will be the active signal. Then, the output voltage waveform will follow S1, which has the same shape as S, but will be delayed by $T_d$, which according to the authors of the article does not matter practically. We do not agree with this latter statement and we believe that this delay $T_d$ does matter practically. In the system described in this article, this delay $T_d$ is compulsory because each time a new S signal is generated, the relevant switch has to be open before the moment when the active signal is applied to the relevant switch. As the system does not know the state of the switches when a new S signal is applied, a delay is still needed to make sure that the relevant switch is open before the active drive signal is applied thereto.

Also known in the art, there is the U.S. Pat. No. 5,436,819 of Nobuhiro MIKAMI et al., granted on Jul. 25, 1995 in which there is described an apparatus for compensating an output voltage error of an inverter that changes direct current power into alternating current power. More specifically, according to this invention, a compensation for an output voltage error is obtained by detecting the polarity of output current from any inverter used to change DC power into AC power. A current detector is used to detect the output current of the inverter circuit. As the output voltage error has the same phase but is opposite in polarity relative to the current output by the inverter, an accurate detection of the output error can be made by detecting the output current polarity.

Also known in the art, there is the U.S. Pat. No. 5,506,484 of James L. MUNRO et al., granted on Apr. 9, 1996, and which describes a pulse width modulator circuit for generating pulses to enable a driver control unit to drive a pair of switching circuits for an electric motor. A compare unit compares a digitized input signal with a digitized triangular waveform to produce an output pulse. A dead-time generator unit produces a first pulse and a second pulse from the output pulse produced by the compare unit. The first and second pulses drive respectively the switching circuits, the first and second pulses having different transition times relative to each other.

Also known in the art, there are the following U.S. Pat. Nos. 5,170,334; 5,099,408; 5,115,387; 5,623,192; 4,926, 302; 5,712,772; 5,668,489; 5,550,450; 5,550,436; 5,546, 052; 5,532,562; 5,450,306; 5,301,085; 5,177,675; 4,719, 400; 4,597,026; 4,658,192; 4,348,734; and 3,654,541.

A drawback with all of the system described above, is that a delay is systematically and deliberately introduced in the gate signals applied to the switches to prevent conduction overlap of the switches.

An object of the present invention is to propose a method and an apparatus for operating two switches connecting respectively a load to power source terminals in response to a switch control signal, where most of the time, there is no delay introduced in the gate signals applied to the switches.

SUMMARY OF THE INVENTION

According to the present invention, there is provided a method of operating two switches connecting respectively a load to power source terminals in response to a switch control signal. The method includes detecting a signal indicative of current direction through the load to identify one of the switches as an active switch. If the switch control signal is for switch if a closing gate signal was previously sent to the active switch, and triggering a predetermined time period on a timer associated to the switch that is actually considered the active switch if the sending step is performed. If the switch control signal is for closing the active switch, the method includes sending an opening gate signal to the other switch if a closing gate signal was previously sent to the other switch, triggering a predetermined time period on a timer associated to the switch that is actually considered the other switch if the sending step is performed, and sending a closing gate signal to the active switch when the predetermined time period of the timer associated with the other switch has elapsed.

According to the present invention, there is also provided an apparatus for operating two switches connecting respectively a load to power source terminals in response to a switch control signal. The apparatus includes a detector for detecting a signal indicative of current direction through the load. The apparatus also identifies one of the switches as an active switch in view of the current direction detected by the detector. The apparatus further sends an opening gate signal to the active switch if the switch control signal is for opening the active switch, and if a closing gate signal was previously sent to the active switch. The apparatus also triggers a predetermined time period on a timer associated to the switch that is actually considered the active switch if the opening gate signal was sent to the active switch. The apparatus also sends an opening gate signal to the other switch if the switch control signal is for closing the active switch, and if a closing gate signal was previously sent to the other switch. The apparatus also triggers a predetermined time period on a timer associated to the switch that is actually considered the other switch if the opening gate signal was sent to the other switch. The apparatus also sends a closing gate signal to the active switch if the control signal is for closing the active switch, when the predetermined time period of the timer associated to the other switch has elapsed.

The objects, advantages and other features of the present invention will become more apparent upon reading up of the following non restrictive description of preferred embodiments thereof given for the purpose of exemplification only with reference to the accompanying drawings.

DETAILED DESCRIPTION OF THE DRAWINGS

Figure 1:
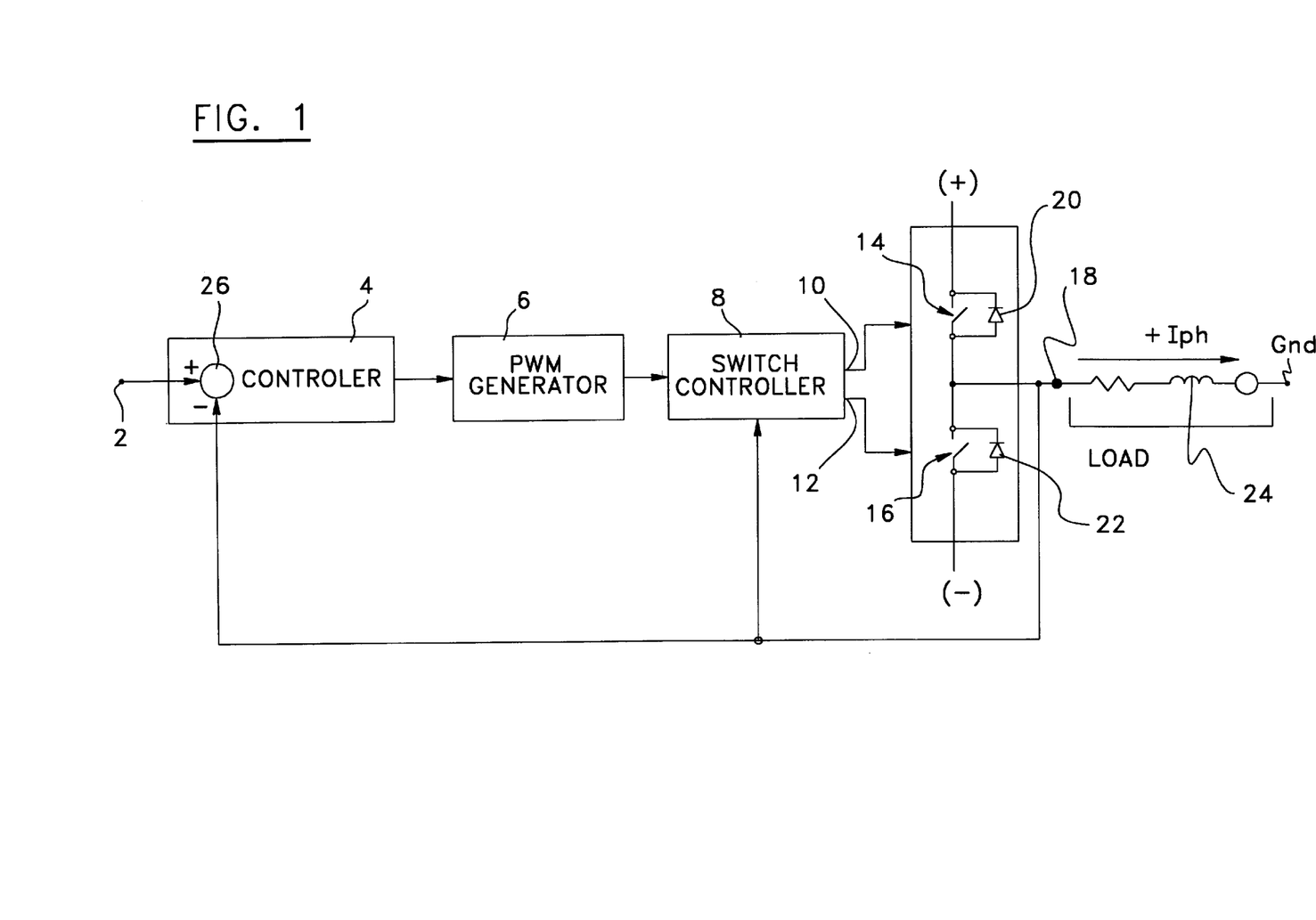
FIG. 1 is a block diagram of an apparatus for operating two switches connecting respectively a load to power source terminals.

Referring now to FIG. 1, a preferred embodiment of the present invention will be described within the context of an application to a three-phase PWM inverter for controlling a three-phase load such as an electric motor. In this FIG. 1, there is shown the circuitry for controlling one phase of the load, similar circuitries being proposed for the other phases of the load. A current command signal CMD is applied to the command input 2. This current command signal determines the load current value that is wanted. The command signal CMD is compared by means of comparator 26 to signal Iph which is representative of the current flowing through a phase of the load. The result of this comparison is processed by the controller 4 to obtain signal Rcycl which is a binary signal indicating a number representative of a cycle ratio. This signal Rcycl is applied to a PWM generator 6 to produce a pulse width modulated signal PWM. This signal PWM is used as a switch control signal applied to a command input of the switch controller 8. The switch controller 8 also receives the signal Iph which is representative of the current flowing through phase of the load.

The switch controller has outputs 10 and 12 for producing gate signals of switches 14 and 16. The switch controller 8 operates the switches 14 and 16 that connect respectively the load to power source terminals +Vdc and -Vdc in response to the signal PWM.

The operation of these switches 14 and 16 determines the amplitude and the direction of current flowing through the phase of the load. The gate signals produced at outputs 10 and 12 of the switch controller 8 depends upon the value of signal PWM and upon the value of the signal Iph which is produced by a current sensor 18 connected in series with the phase of the load. The switch controller 8 is provided with a memory for storing values of timers that keep track of precedent status of switches 14 and 16. Because of this memory, most of the time, no time delay has to be introduced between the signal PWM and gate signals produced at outputs 10 and 12. As there are means for keeping track of precedent status of the switches 14 and 16, a delay will be introduced only when the precedent status of the switches 14 and 16 does not allow an immediate operation of the switch that is currently considered active. A single timer can be used for keeping track of both switches 14 and 16. The timer is then momentarily associated to one of the two timers.

Hereinafter, the phase to be controlled will be referred to as the load. For each load, two switches 14 and 16 are needed. Two anti-parallel diodes 20 and 22 are connected respectively to the switches 14 and 16. The current sensor 18 is needed to detect the amplitude and direction of the current Iph flowing through the load. The load must have an inductive element 24 or a source current. The voltage applied to the load is determined by the operation of power switches 14 and 16 which are controlled by the switch controller 8. This switch controller 8 determines the switching sequence.

The apparatus for operating the two switches 14 and 16 according to the present invention comprises preferably the switch controller 8 and the current sensor 18. The current sensor 18 provides a signal representative of the actual amplitude and direction of the current.

The switch controller 8 comprises a microcontroller with a software to embody different means which will be described hereinafter. The switch controller 8 comprises an identifying means for identifying one of the switches 14 and 16 as the active switch in view of the actual current direction detected by current sensor 18. But, according to an alternative embodiment, the identifying means can base its decision upon a signal representative of the command signal applied to command input 2. For example, in the present case, when the current direction of Iph is positive as shown in FIG. 1, the switch 14 will be considered as the active switch. If current direction of Iph is negative then switch 16 will be considered as the active switch.

The switch controller 8 also embodies first sending means for sending a gate signal having an opening level to the active switch 14 if the switch control signal PWM received by the switch controller 8 is for opening the active switch 14, and if a gate signal having a closing level was previously sent to the active switch 14. If a gate signal with a closing level was not previously sent to the active switch 14 it means that the switch 14 is already open and therefore there is no need to send an opening gate signal thereto. It should be understood that the gate signal operates on two levels, an opening level for opening the switch to which the signal is applied, and a closing level for closing it. In the present description we will refer to an opening gate signal as a gate signal with an opening level, and to a closing gate signal as a gate signal with a closing level. The switch controller knows all the time the current levels of the gate signals applies to both switches 14 and 16.

The switch controller 8 also embodies a first triggering means for triggering a predetermined time period on the first timer associated to the switch 14 that is actually considered the active switch if an opening gate signal is sent to the active switch by the first sending means. The triggering of this predetermined time period indicates that an opening gate signal has been sent to the switch 14 but this switch is not necessarily open yet. At the end of this time period, the apparatus will consider that the active switch is actually open. By means of the first timer, the switch controller 8 keeps track of the last time that an opening gate signal was sent to the active switch. With this information the switch controller 8 can know exactly when it can consider that the active switch 14 is actually open.

Now we will describe other means embodied by the switch controller 8 for controlling the active switch in a case where the switch control signal PWM is for closing the active switch. These other means include second and third sending means and a second triggering means. The second sending means is for sending an opening gate signal to the other switch 16 if the switch control signal PWM is for closing the active switch 14 and if a closing gate signal was previously sent to the other switch 16.

The second triggering means is for triggering a predetermined time period on a second timer associated to the switch 16 that is actually considered the other switch if the opening gate signal is sent to the other switch 16 by the second sending means. This predetermined time period is representative of the fact that an opening gate signal has been sent to the other switch 16 but as long as the predetermined time period is not over the apparatus does not consider that the other switch 16 is actually open. By means of the second timer, the switch controller 8 keeps track of the last time that an opening gate signal was sent to the other switch.

The third sending means is for sending a closing gate signal to the active switch 14 if the control signal PWM is for closing the active switch, when the predetermined time period of the timer associated with the other switch 16 has elapsed.

The timers mentioned above are not discrete components but rather timers embodied by the software of the switch controller 8. Of course, discrete component can also be used. The means of the switch controller 8 are embodied by a micro-controller provided with a software, but they can also be embodied by discrete hardware elements, or a mix of software and hardware elements.

Preferably, the switch controller 8 also embodies first sampling means, means for performing and third triggering means. The first sampling means is for sampling the switch control signal PWM at a first frequency. The means for performing is for performing a series of cycles through, the detecting means, the identifying means, the first, second and third sending means and the first and second triggering means. The series of cycles is based on the switch control signal PWM that is sampled by the first sampling means. The third triggering means is for triggering the first sampling means and the means for performing into a new series of cycles based on the new switch control signal.

Preferably the detecting means embodied by the switch controller 8 also comprises a disabling/enabling means for disabling the first, second and third sending means and the first and second triggering means as long as the signal detected by the detecting means is nil or close to nil within predetermined limits, and for enabling the following means which are also parts of the apparatus, as long as the signal detected by the detecting means is nil or close to nil. These following means comprise fourth, fifth, sixth and seventh sending means, and two triggering means. The operation of these means can also be understood in relation to FIG. 7.

Figure 7:
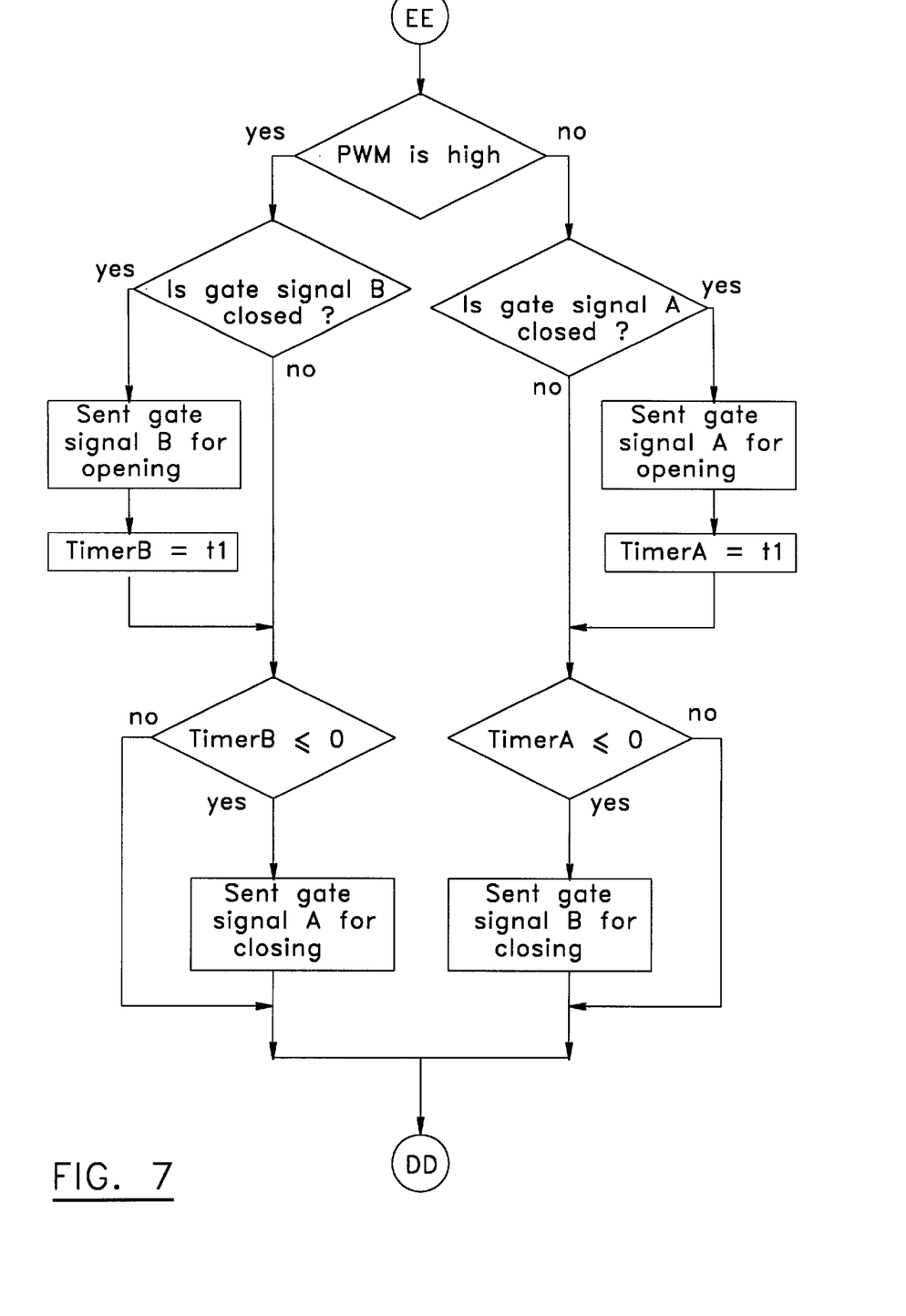
FIG. 7 is a flow chart of a preferred embodiment of the method in relation to the operation mode of FIG. 6.

The fourth sending means is for sending an opening gate signal to the active switch if the switch control signal is for opening the active switch and if a closing gate signal was previously sent to the active switch. One of the triggering means is for triggering a predetermined time period on a timer associated to the switch that is actually considered the active switch if the opening gate signal is sent to the active switch by the fourth sending means. The fifth sending means is for sending a closing gate signal to the other switch if the switch control signal is for opening the active switch, when the predetermined time period of the timer associated with the active switch has elapsed. The sixth sending means is for sending an opening gate signal to the other switch if the switch control signal is for closing the active switch and if a closing gate signal was previously sent to the other switch. The second triggering means is for triggering a predetermined time period on a timer associated to the switch that is actually considered the other switch if the opening gate signal is sent to the other switch by the sixth sending means. The seventh sending means is for sending a closing gate signal to the active switch if the switch control signal is for closing the active switch, when the predetermined time period of the timer associated with the other switch has elapsed.

According to an alternative embodiment, preferably, the detecting means embodied by the switch controller 8 comprise a disabling/enabling means for disabling the first, second and third sending means and the first and second triggering means as long as the signal detected by the detecting means is nil or close to nil within predetermined limits, and for enabling the following means which are also parts of the apparatus, as long as the signal detected by the detecting means is nil or close to nil. These following means comprise two sending means and two triggering means. The operation of these means can also be understood in relation to FIG. 8.

Figure 8:
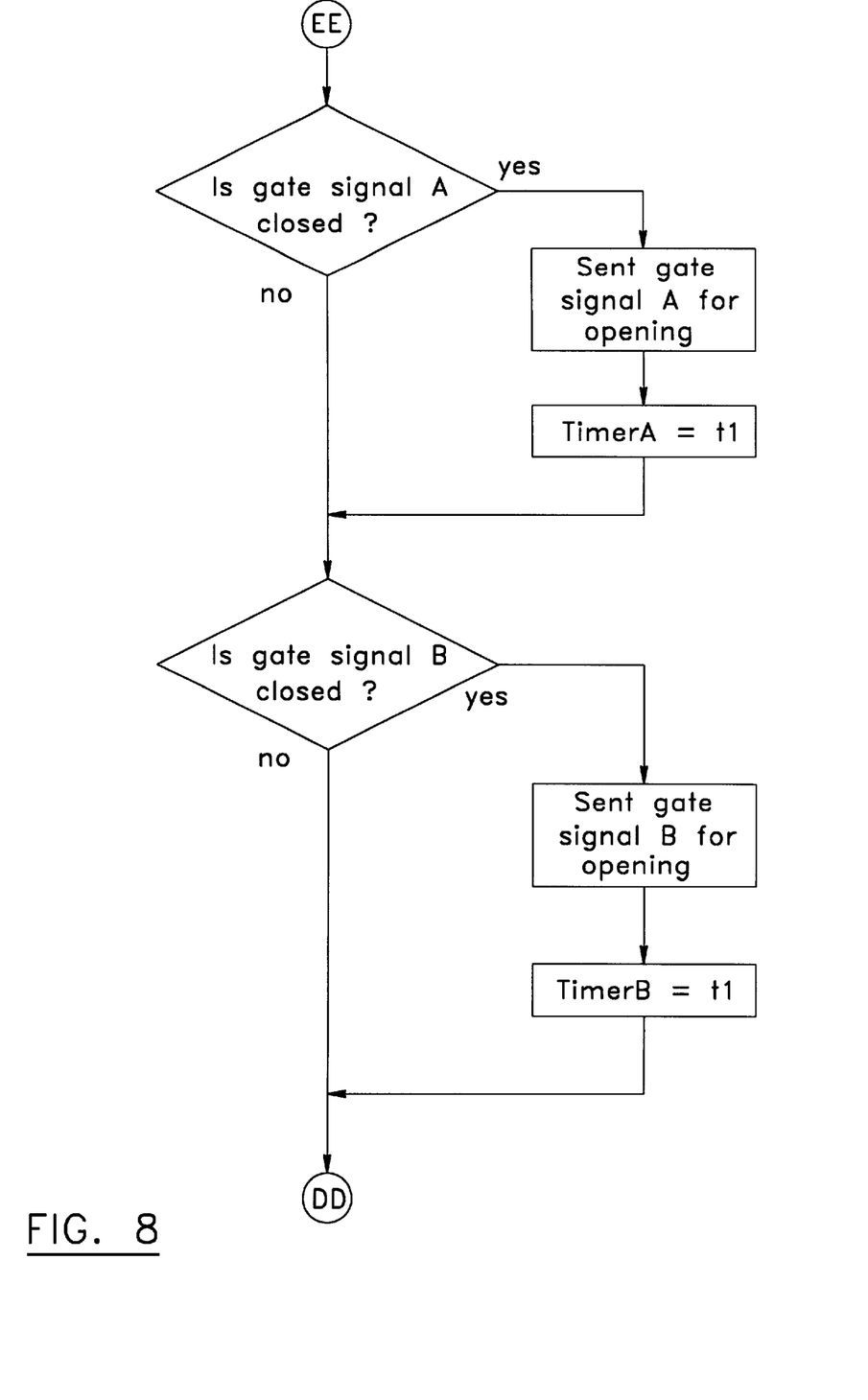
FIG. 8 is a flow chart of a preferred alternative embodiment of the method in relation to the operation mode of FIG. 6.

One of the sending means is for sending an opening gate signal to the active switch if a closing gate signal was previously sent to the active switch. One of the triggering means is for triggering a predetermined time period on a timer associated to the switch that is actually considered the active switch if the opening gate signal is sent to the active switch by the fourth sending means. The second sending means is for sending an opening gate signal to the other switch if a closing gate signal was previously sent to the other switch. The second triggering means is for triggering a predetermined time period on a timer associated to the switch that is actually considered the other switch if the opening gate signal is sent to the other switch by the fifth sending means.

Preferably, the apparatus additionally comprises a controller 4 and a PWM generator 6. The controller 4 embodies second sampling means, a comparator 26 and a calculator. The second sampling means is for sampling current command signal CMD and signal Iph which is representative of the actual direction and amplitude of the current flowing through the load, at a second frequency that is slower than the first frequency. The comparator 26 is for comparing the two signals sampled by the second sampling means to obtain a current error signal. The calculator is for calculating signal Rcycl from the current error signal. The PWM generator is for producing a new switch control signal PWM from signal Rcycl. The signal Rcycl is a number indicative of a cycle ratio that is calculated in a standard manner from the current error signal.

Figure 2:
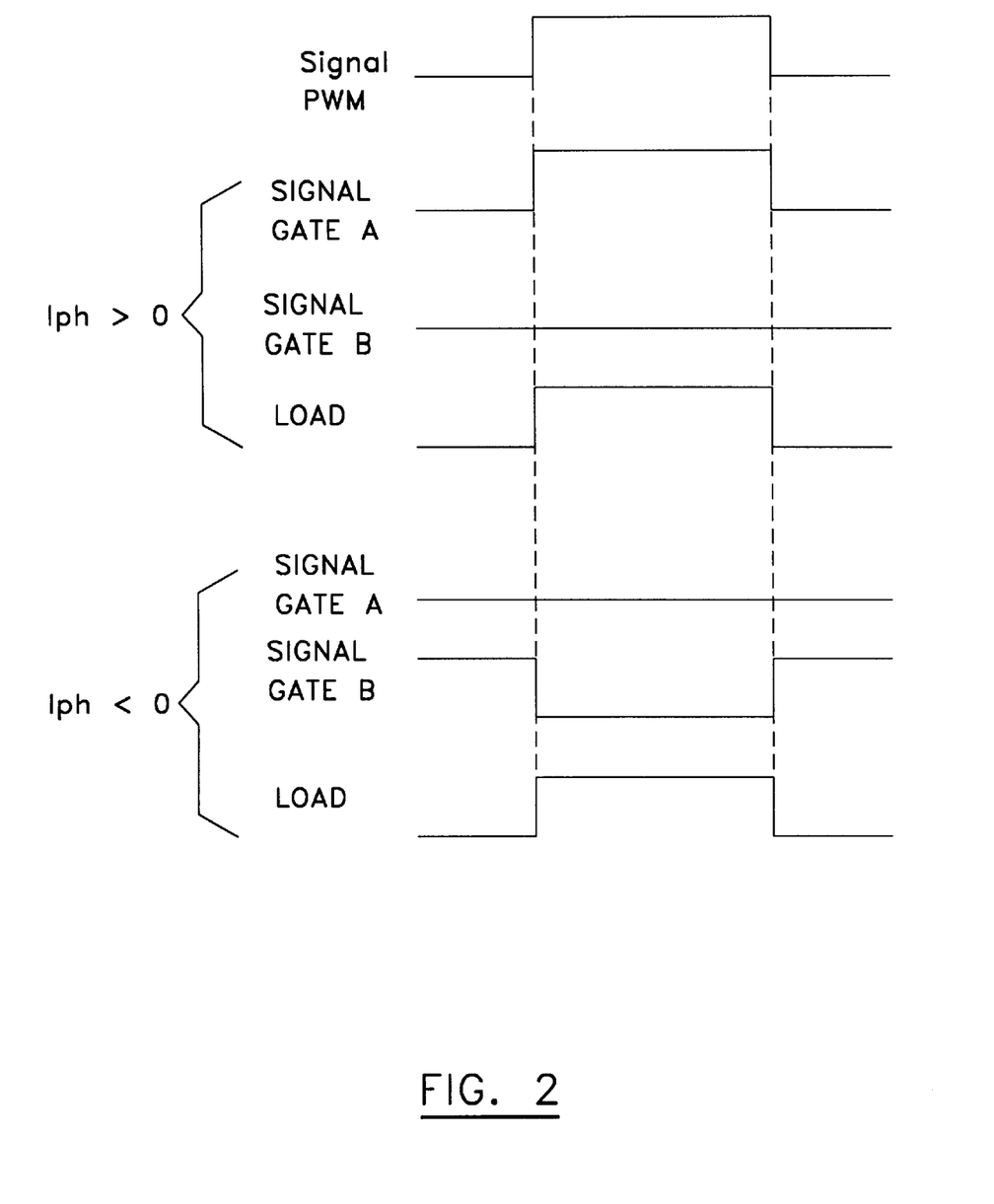
FIG. 2 is a signal diagram in relation to FIG. 1 according to the present invention.

Referring now to FIGS. 1 and 2, we will now show the relation between signal PWM, gate signals produced at outputs 10 and 12, and load signal which is the signal applied to the load. In FIG. 2, in the top part, there is shown the signal PWM. In the upper part of this figure below the signal PWM, there are shown signals that are obtained in the situation where current signal Iph is positive. In the lower part of this figure, there are shown signals that are obtained in the situation where the current signal Iph is negative. Signal gate A is the signal applied to the gate of switch 14, and signal gate B is the gate signal applied to the gate of the switch 16.

The operation mode shown in this FIG. 2 is the operation mode that occurs most of the time which means that no delay has to be introduced between signal PWM and the gate signals A and B as shown in FIG. 2. The only time that there will be a time delay introduced between signal PWM and the gate signals is when it will not be possible to close the active switch because the other switch is closed. In this situation, a small delay will be introduced to allow the opening of the other switch before the closing of the switch that is currently considered active. But, these delays are exceptionally introduced. In the FIG. 2, when the gate signal is high it means that the gate signal is for closing the corresponding switch whereas when the gate signal is low it means that the gate signal is for opening the corresponding switch.

Figure 4A:
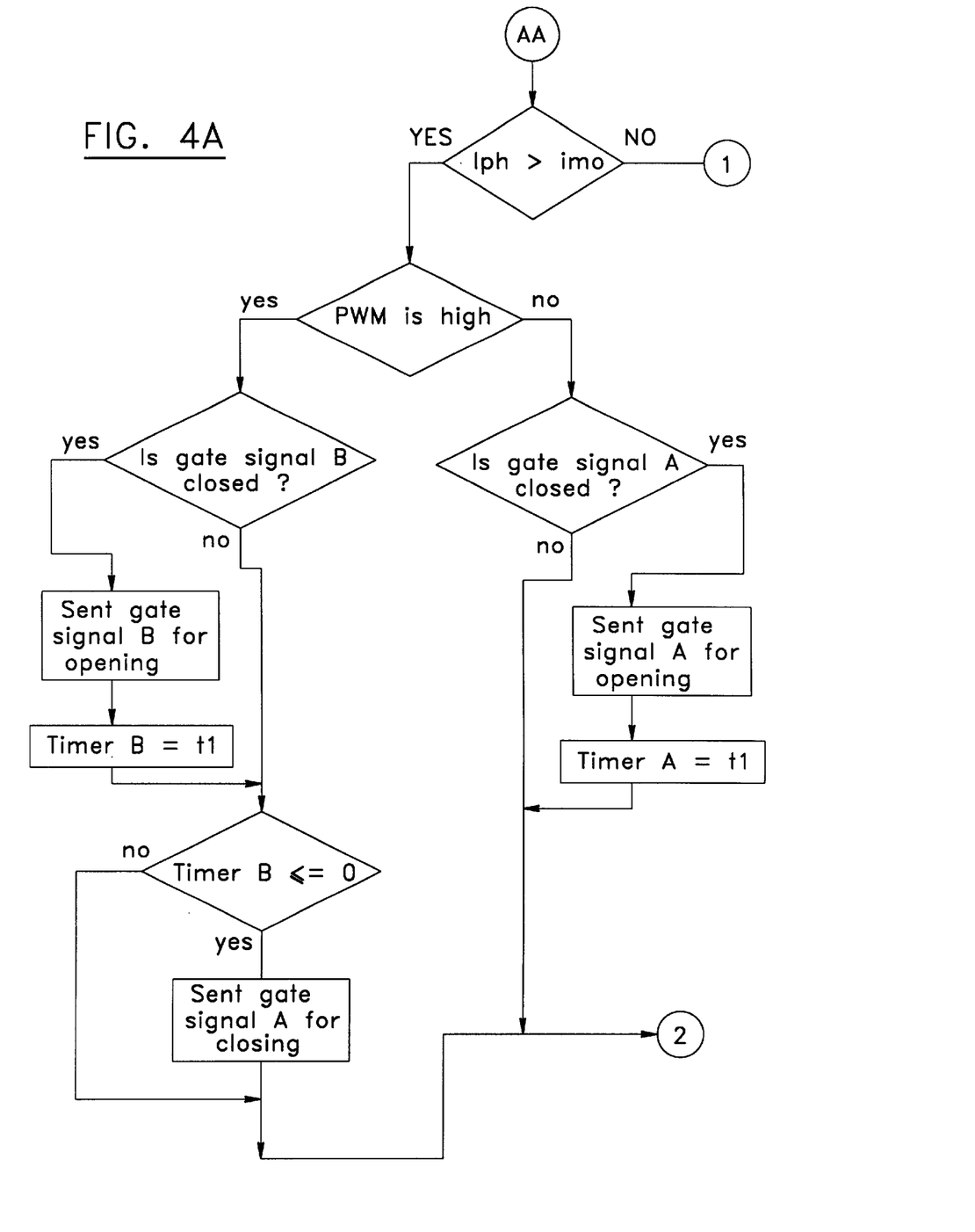
Figure 4B:
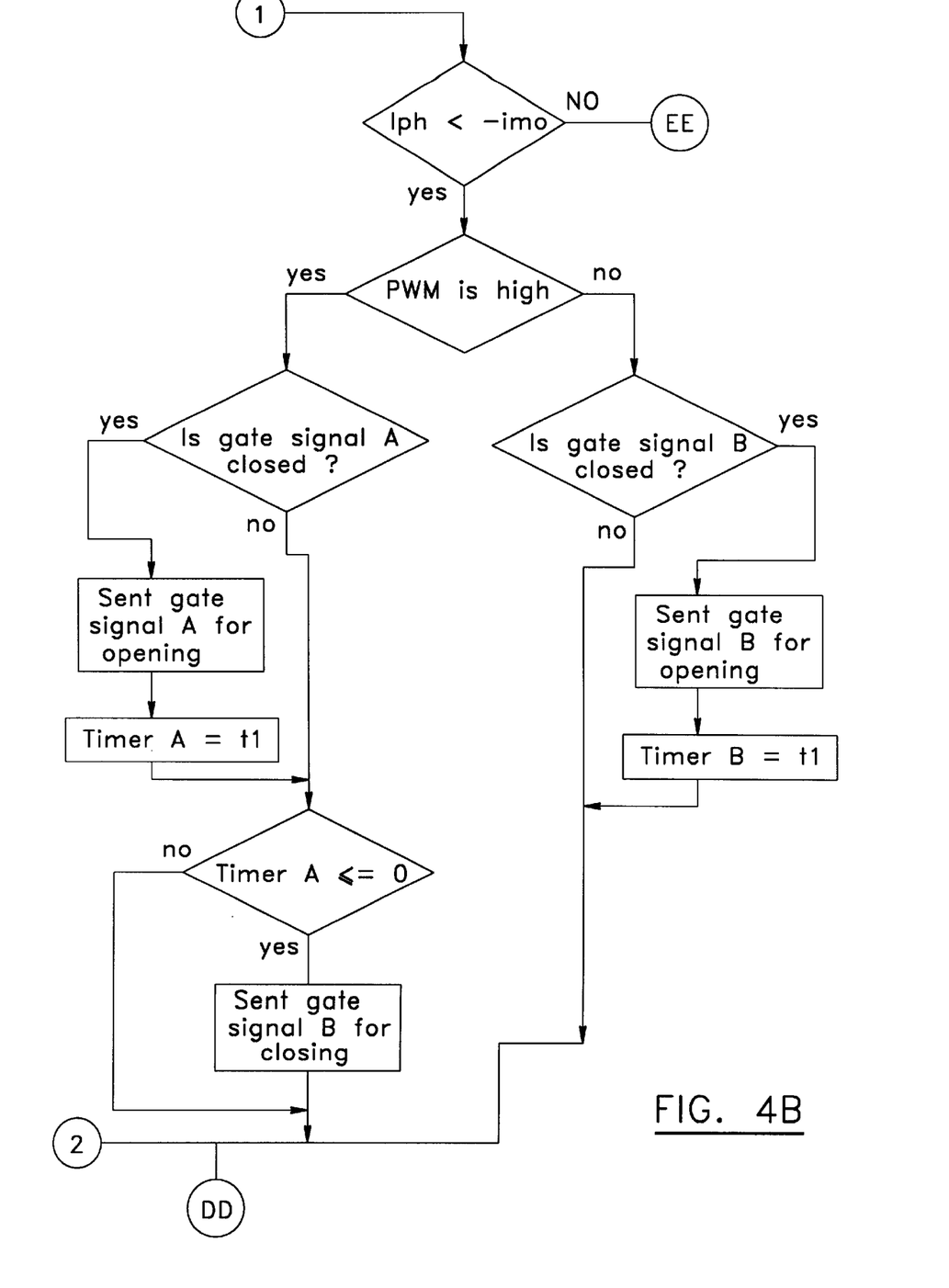

Referring now to FIGS. 1, 4A and 4B, we will now explain a method of operating the two switches 14 and 16 in response to a switch control signal according to the present invention. In the present situation, the switch control signal is signal PWM. The method comprises steps (a), (b) and (c).

The step (a) is a step of detecting current direction through the load to identify one of the switches 14 and 16 as active switches. The current signal Iph is detected by current detector 18 and supplied to the switch controller 8. The switch controller 8 determines whether Iph is positive or negative. If Iph is positive (FIG. 4A), this means that switch 14 will be considered as active switch and accordingly signal PWM will be applied thereto. Then, switch 16 will be considered as the irrelevant switch. If Iph is negative (FIG. 4B), this means that switch 16 is considered the active switch. Preferably, in a case where Iph is nil or close to nil then the method will proceed with either the steps shown in FIG. 7 or the steps shown in FIG. 8.

Referring to FIGS. 1, 3, 4A and 4B, the step (b) of the method comprises, if signal PWM is for opening the active switch, (i) sending signal PWM to the gate of the active switch if a closing gate signal was previously sent to the active switch 14, and (ii) triggering a predetermined time period on timer A associated to the switch 14 if the sending of step (i) is performed. This means that if a closing gate signal was not previously sent to the active switch 14, the switch 14 is already open and there is no need to apply a signal to the gate thereof for opening it. In step (b), steps (i) and (ii) are performed if the responses to the questions "PWM is high?" (FIGS. 4A and 4B), and "Is gate signal A closed?" (FIG. 4A) or "Is gate signal B closed?" (FIG. 4B) are respectively no, and yes.

The step (c) of the method comprises, if the signal PWM is for closing the active switch 14, (iii) sending an opening gate signal to the other switch 16 if a closing gate signal was previously sent to this other switch 16, (iv) triggering a predetermined time period on timer B associated with switch 16 if the sending of step (iii) is performed, and (v) sending a closing gate signal to the active switch 14 when the predetermined time period of timer B has elapsed. Most of the time, timer B will be already elapsed and signal PWM can then be directly applied to the gate of switch 14 without any time delay. In step (c), steps (iii) and (iv) are performed if responses to the questions "PWM is high?" (FIGS. 4A and 4B) and "Is gate signal B closed?" (FIG. 4A) or "Is gate signal A closed?" (FIG. 4B) are respectively yes and yes. Step (v) is performed if the response to the question "Timer $B \leq 0$?" (FIG. 4A) or "Timer $A \leq 0$?" (FIG. 4B) is yes.

Referring now to FIGS. 1, 3, 4 and 5, preferably, the method further comprises first steps (I) of sampling the signal PWM, or reading PWM, at a first frequency, and performing a series of cycles through steps (a), (b) and (c), the series of cycles being based on signal PWM that is sampled. The cycles of the series are performed through the loop determined by the branch CC. Each time that the method goes through the loop, timers A and B are decremented if their value is higher than zero, and a count is incremented.

Figure 3:
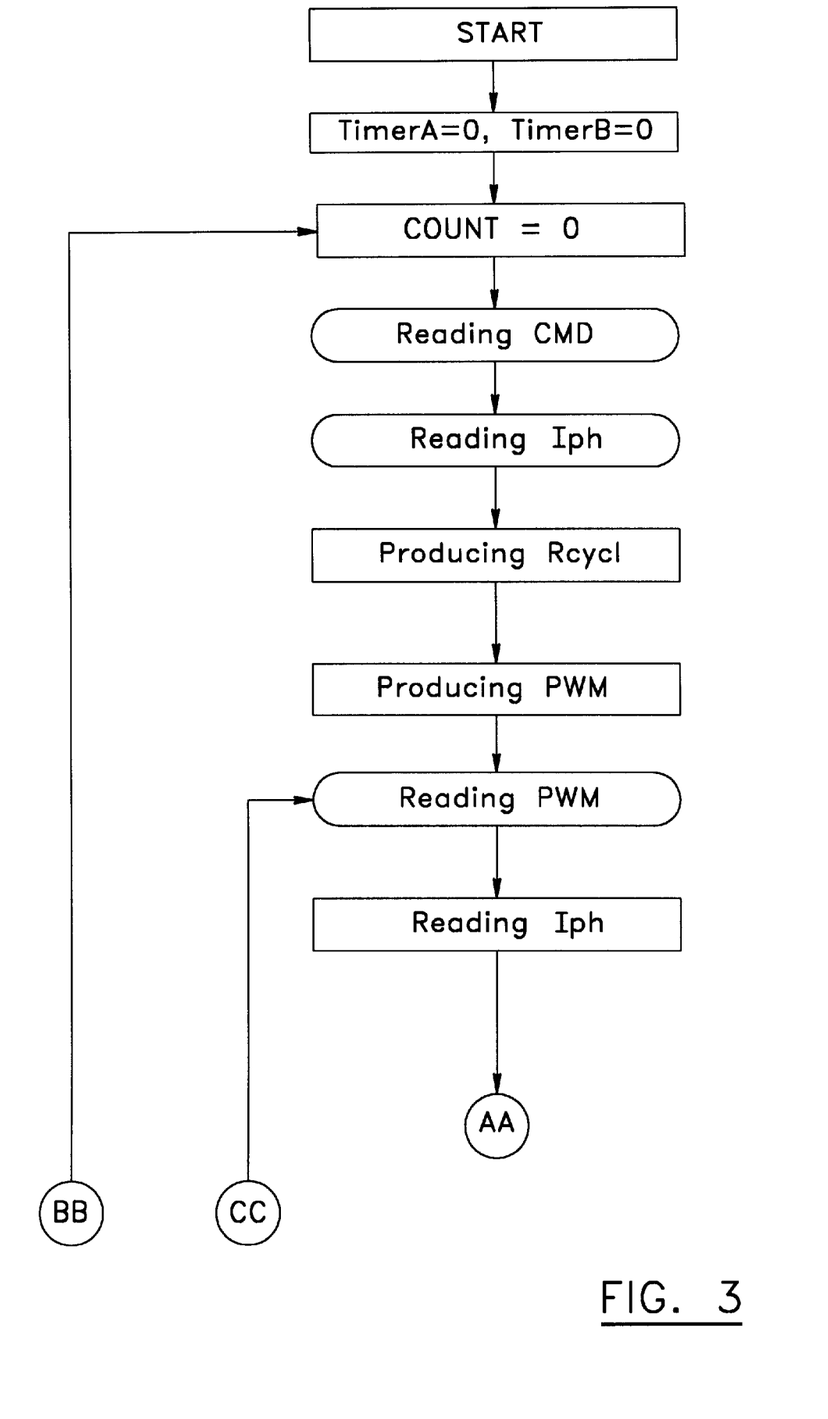
FIGS. 3, 4A, 4B and 5 are a flow chart of a method of operating two switches connecting respectively a load to power source terminals in response to the switch control signal, according to a preferred embodiment of the present invention.

Preferably, when the count goes beyond a given value X, then the method further comprises second steps (II) of sampling a current command signal CMD "reading CMD" at input 2 and signal Iph "reading Iph" which is representative of the actual direction and amplitude of the current flowing through the load, at a second frequency that is slower than the first frequency; producing a current error signal by comparing the two signals sampled in steps (II); calculating signal Rcycl "producing Rcycl" from the current error signal; producing a new signal PWM "producing PWM" by applying the signal Rcycl to PWM generator 6, and returning to step (I) to start a new series of cycles based on the new signal PWM. The second steps (II) are performed within the loop determined by the branch BB, as shown in FIG. 3.

Figure 5:
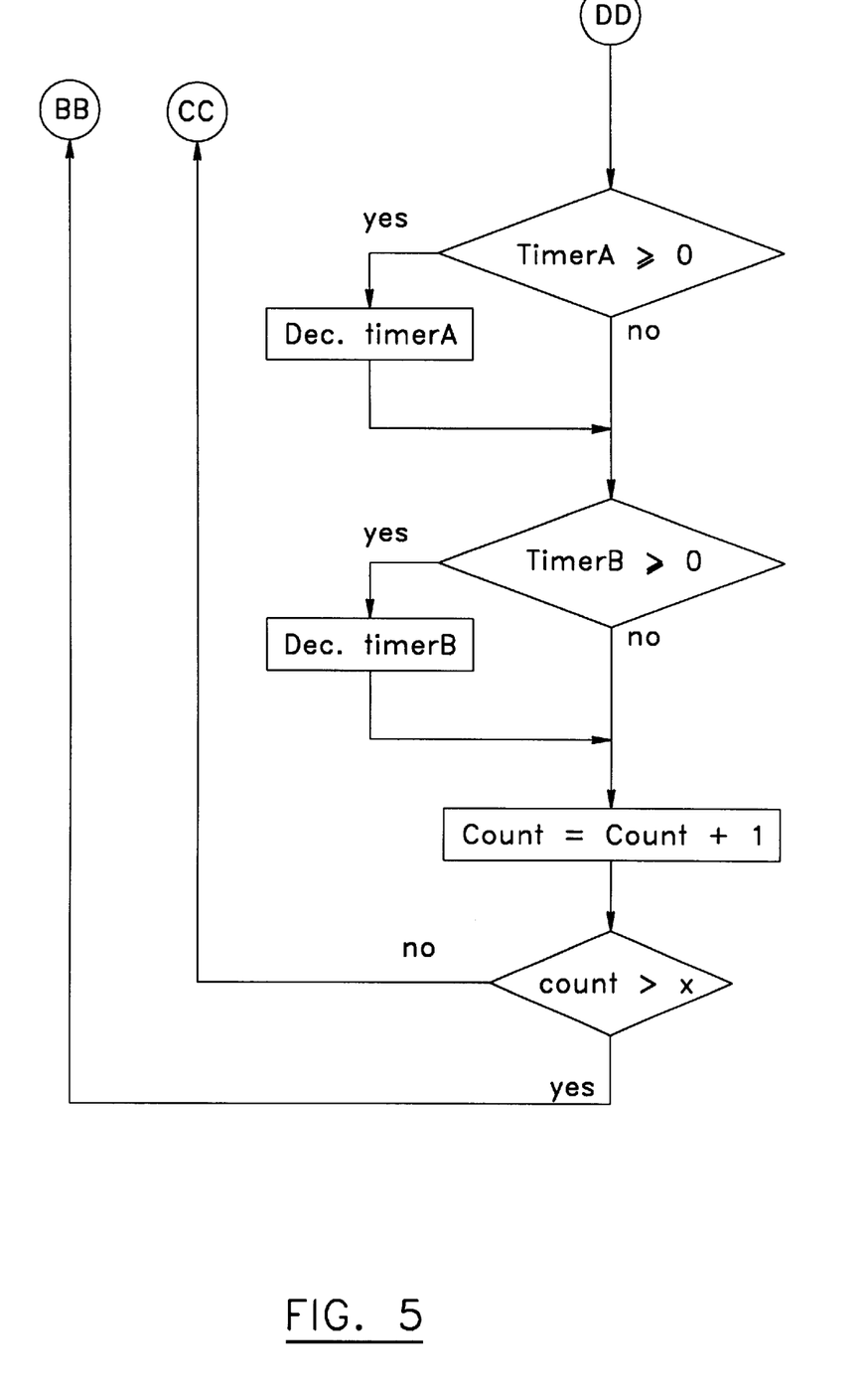

The second frequency mentioned steps (II) is determined by the count shown in FIG. 5. As long as the count is not reached, the cycles are performed through steps (a), (b) and (c). When the value of the count is higher than the value X then a new series of cycles is performed based on the new signal PWM. More the value X is high more the second frequency is low. For example, the value of X can be of 50 $\mu$sec.

Figure 6:
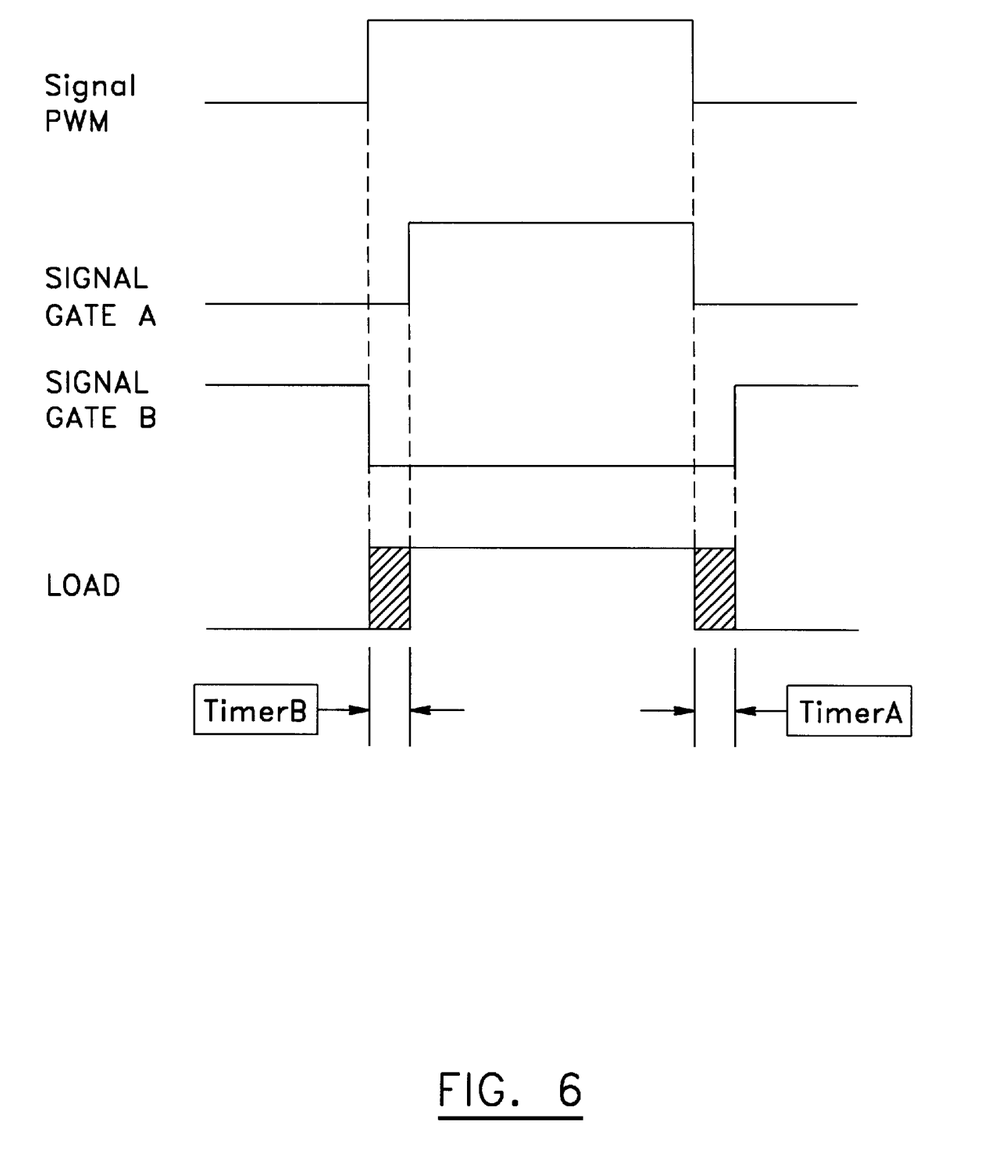
FIG. 6 is a signal diagram in relation to a particular operation mode where Iph is nil or close to nil.

Referring now to FIGS. 1 and 6, we will now show, according to preferred embodiments as shown in FIGS. 7 and 8, the relation between signal PWM, gate signals produced at outputs 10 and 12, and load signal which is the signal applied to the load, in a case where Iph is nil or close to nil, between predetermined limits −imo and +imo. In FIG. 6, in the top part, there is shown the signal PWM. Signal gate A is the signal applied to the gate of switch 14, and signal gate B is the gate signal applied to the gate of the switch 16. The operation mode shown in this FIG. 6 is an operation mode that seldom occurs. However, when this operation mode occurs, small delays are introduced between signal PWM and load signal by means of timers A and B, as shown in FIG. 6.

Referring now to FIG. 7, there is shown a preferred embodiment of the method that occurs, in step (a), when the signal responsive to the current direction is nil or close to nil within limits determined by +imo and −imo. According to this preferred embodiment, the following steps (d) and (e) are performed instead of steps (b) and (c). Step (d) consists of, if the switch control signal is for opening the active switch, (vi) sending an opening gate signal to the active switch if a closing gate signal was previously sent to the active switch, (vii) triggering a predetermined time period on a timer associated to the switch that is actually considered the active switch if the sending of step (vi) is performed, and (viii) sending a closing gate signal to the other switch when the predetermined time period of the timer associated with the active switch has elapsed. In step (d), steps (vi) and (vii) are performed if the responses to the questions "PWM is high?" and "Is gate signal A closed?" are respectively no and yes. Step (viii) is performed if the response to the question "Timer A$\leq$0?" is yes.

Step (e) consists of, if the switch control signal is for closing the active switch (ix) sending an opening gate signal to the other switch if a closing gate signal was previously sent to the other switch, (x) triggering a predetermined time period on a timer associated to the switch that is actually considered the other switch if the sending of step (ix) is performed, and (xi) sending a closing gate signal to the active switch when the predetermined time period of the timer associated with the other switch has elapsed. In step (e), steps (ix) and (x) are performed if the responses to the questions "PWM is high?" and "Is gate signal B closed?" are respectively yes and yes. Step (xi) is performed if the response to the question "Timer B$\leq$0?" is yes.

Referring now to FIG. 8, there is shown another preferred embodiment of the method that occurs, in step (a), when the signal responsive to the current direction is nil or close to nil within limits determined by +imo and −imo. This preferred embodiment is an alternative to the preferred embodiment shown in FIG. 7. According to this preferred embodiment shown in FIG. 8, the following steps (xii), (xiii), (xiv) and (xv) are performed instead of steps (b) and (c). Step (xii) consists of sending an opening gate signal to the active switch if a closing gate signal was previously sent to the active switch. Step (xiii) consists of triggering a predetermined time period on a timer associated to the switch that is actually considered the active switch if the sending of step (xii) is performed.

Step (xiv) consists of sending an opening gate signal to the other switch if a closing gate signal was previously sent to the other switch. Step (xv) consists of triggering a predetermined time period on a timer associated to the switch that is actually considered the other switch if the sending of step (xiv) is performed. Steps (xii) and (xiii) are performed if the response to the question "Is gate signal A closed?" is yes, and steps (xiv) and (xv) are a performed if the response to the question "Is gate signal B closed?" is yes. A person skilled in the art will understand that according to this preferred embodiment, no switching of the switches A and B are performed when Iph is nil or close to nil, the switches A and B being simply opened if they are not already opened, and left opened.

Although, the present invention has been explained hereinabove by way of a preferred embodiments thereof, it should point out that any modifications to these preferred embodiments, within the scope of the appended claims is not deemed to change or alter the nature and scope of the invention.

What is claimed is:

1. A method of operating two switches connecting respectively a load to power source terminals in response to a switch control signal, the method comprising the steps of:

a) detecting a signal indicative of current direction through the load to identify one of the switches as active switch;

b) if the switch control signal is for opening the active switch, (i) sending an opening gate signal to the active switch if a closing gate signal was previously sent to the active switch, and (ii) triggering a predetermined time period on a timer associated to the switch that is actually considered the active switch if the sending of step (i) is performed; and c) if the switch control signal is for closing the active switch, (iii) sending an opening gate signal to the other switch if a closing gate signal was previously sent to the other switch, (iv) triggering a predetermined time period on a timer associated to the switch that is actually considered the other switch if the sending of step (iii) is performed, and (v) sending a closing gate signal to the active switch when the predetermined time period of the timer associated with the other switch has elapsed.

2. A method according to claim 1, wherein, in step (a), the signal is indicative of the actual current direction through the load.

3. A method according to claim 2, further comprising steps of:

(I) sampling the switch control signal at a first frequency, and performing a series of cycles through steps (a), (b) and (c), the series of cycles being based on the switch control signal that is sampled; and (II) sampling a current command signal and a signal representative of the actual direction and amplitude of the current flowing through the load at a second frequency that is slower than the first frequency, producing a current error signal by comparing the two signals sampled in step (II), calculating a cycle signal from the current error signal, producing a new switch control signal by applying the cycle signal to a PWM generator, and returning to step (I) to start a new series of cycles based on the new switch control signal.

4. Method according to claim 1, wherein, in step (a), when the signal responsive to the current direction is closed to a nil value within limits determined by +imo and −imo, then the following steps are performed instead of steps (b) and (c):

d) if the switch control signal is for opening the active switch, (vi) sending an opening gate signal to the active switch if a closing gate signal was previously sent to the active switch, (vii) triggering a predetermined time period on a timer associated to the switch that is actually considered the active switch if the sending of step (vi) is performed, and (viii) sending a closing gate signal to the other switch when the predetermined time period of the timer associated with the active switch has elapsed; and e) if the switch control signal is for closing the active switch, (ix) sending an opening gate signal to the other switch if a closing gate signal was previously sent to the other switch, (x) triggering a predetermined time period on a timer associated to the switch that is actually considered the other switch if the sending of step (ix) is performed, and (xi) sending a closing gate signal to the active switch when the predetermined time period of the timer associated with the other switch has elapsed.

5. Method according to claim 1, wherein, in step (a), when the signal responsive to the current direction is closed to a nil value within limits determined by +imo and −imo, then the following steps are performed instead of steps (b) and (c):

(xii) sending an opening gate signal to the active switch if a closing gate signal was previously sent to the active switch, (xiii) triggering a predetermined time period on a timer associated to the switch that is actually considered the active switch if the sending of step (xii) is performed, (xiv) sending an opening gate signal to the other switch if a closing gate signal was previously sent to the other switch, and (xv) triggering a predetermined time period on a timer associated to the switch that is actually considered the other switch if the sending of step (xiv) is performed.

6. An apparatus for operating two switches connecting respectively a load to power source terminals in response to a switch control signal, the apparatus comprising:

detecting means for detecting a signal indicative of current direction through the load;

identifying means for identifying one of the switches as active switch in view of the current direction detected by the detecting means;

first sending means for sending an opening gate signal to the active switch if the switch control signal is for opening the active switch, and if a closing gate signal was previously sent to the active switch;

first triggering means for triggering a predetermined time period on a timer associated to the switch that is actually considered the active switch if the opening gate signal is sent to the active switch by the first sending means;

second sending means for sending an opening gate signal to the other switch if the switch control signal is for closing the active switch, and if a closing gate signal was previously sent to the other switch;

second triggering means for triggering a predetermined time period on a timer associated to the switch that is actually considered the other switch if the opening gate signal is sent to the other switch by the second sending means; and third sending means for sending a closing gate signal to the active switch if the control signal is for closing the active switch, when the predetermined time period of the timer associated to the other switch has elapsed.

7. An apparatus according to claim 6, wherein the signal detected by the detecting means is indicative of the actual current direction through the load.

8. An apparatus according to claim 7, further comprising:

first sampling means for sampling the switch control signal at a first frequency;

means for performing a series of cycles through the detecting means, the identifying means, the first, second and third sending means and the first and second triggering means, the series of cycles being based on the switch control signal that is sampled by the first sampling means;

second sampling means for sampling a current command signal and a signal representative of the actual direction and amplitude of the current flowing through the load, at a second frequency that is slower than the first frequency;

a comparator for comparing the two signals sampled by the second sampling means to obtain a current error signal;

a calculator for calculating a cycle signal from the current error signal;

a PWM generator for producing a new switch control signal from the cycle signal; and third triggering means for triggering the first sampling means and the means for performing into a new series of cycles based on the new switch control signal.

9. An apparatus according to claim 7, wherein:

the detecting means is a current sensor connected in series with the load; and the identifying means, the first, second and third sending means and the first and second triggering means are embodied by a switch controller provided with software.

10. An apparatus according to claim 8, wherein:

the detecting means is a current sensor connected in series with the load;

the identifying means, the first, second and third sending means, the first, second and third triggering means, the first and the means for performing are embodied by a switch controller provided with a software; and the second sampling means, the comparator and the calculator are embodied by a controller provided with a software.

11. Apparatus according to claim 6, wherein the detecting means comprise a disabling/enabling means for disabling the first, second and third sending means and the first and second triggering means as long as the signal detected by the detecting means is nil or closed to nil within predetermined limits, and for enabling the following means which are also parts of the apparatus, as long as the signal detected by the detecting means is nil or closed to nil within the predetermined limits:

fourth sending means for sending an opening gate signal to the active switch if the switch control signal is for opening the active switch and if a closing gate signal was previously sent to the active switch;

third triggering means for triggering a predetermined time period on a timer associated to the switch that is actually considered the active switch if the opening gate signal is sent to the active switch by the fourth sending means;

fifth sending means for sending a closing gate signal to the other switch if the switch control signal is for opening the active switch, when the predetermined time period of the timer associated with the active switch has elapsed;

sixth sending means for sending an opening gate signal to the other switch if the switch control signal is for closing the active switch and if a closing gate signal was previously sent to the other switch;

fourth triggering means for triggering a predetermined time period on a timer associated to the switch that is actually considered the other switch if the opening gate signal is sent to the other switch by the sixth sending means;

seventh sending means for sending a closing gate signal to the active switch if the switch control signal is for closing the active switch, when the predetermined time period of the timer associated with the other switch has elapsed.

12. Apparatus according to claim 6, wherein the detecting means comprise a disabling/enabling means for disabling the first, second and third sending means and the first and second triggering means as long as the signal detected by the detecting means is nil or closed to nil within predetermined limits, and for enabling the following means which are also parts of the apparatus, as long as the signal detected by the detecting means is nil or closed to nil within the predetermined limits:

fourth sending means for sending an opening gate signal to the active switch if a closing gate signal was previously sent to the active switch;

third triggering means for triggering a predetermined time period on a timer associated to the switch that is actually considered the active switch if the opening gate signal is sent to the active switch by the fourth sending means;

fifth sending means for sending an opening gate signal to the other switch if a closing gate signal was previously sent to the other switch; and fourth triggering means for triggering a predetermined time period on a timer associated to the switch that is actually considered the other switch if the opening gate signal is sent to the other switch by the fifth sending means.

* * * * *